(12) United States Patent
Edwards et al.

(10) Patent No.: US 6,275,381 B1
(45) Date of Patent: *Aug. 14, 2001

(54) THERMAL PASTE PREFORMS AS A HEAT TRANSFER MEDIA BETWEEN A CHIP AND A HEAT SINK AND METHOD THEREOF

(75) Inventors: David L. Edwards, Poughkeepsie; Glenn G. Daves, Beacon; Shaji Farooq, Hopewell Junction; Sushumna Iruvanti, Wappingers Falls; Frank L. Pompeo, Montgomery, all of NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/208,790

(22) Filed: Dec. 10, 1998

(51) Int. Cl.⁷ .................................................. H05K 7/20
(52) U.S. Cl. ..................... 361/717; 361/705; 361/706; 361/718; 165/80.2; 165/185; 174/16.3; 257/713; 438/106; 438/122
(58) Field of Search ..................... 361/702, 704, 361/705, 706, 707, 713, 722, 717–719; 165/80.3, 185; 174/16.3, 252, 52.4; 257/706, 707, 712, 713, 722, 730, 731

(56) References Cited

U.S. PATENT DOCUMENTS

| | | |
|---|---|---|
| 3,993,123 | 11/1976 | Chu et al. . |
| 4,654,754 * | 3/1987 | Daszkowski .................... 361/708 |
| 4,715,430 * | 12/1987 | Arnold et al. .................... 165/80.3 |
| 4,914,551 * | 4/1990 | Anschel et al. .................... 361/714 |
| 5,168,926 * | 12/1992 | Watson et al. .................... 165/185 |
| 5,276,586 * | 1/1994 | Hatsuda et al. .................... 165/185 |
| 5,291,371 | 3/1994 | Gruber et al. . |
| 5,406,025 | 4/1995 | Carlstedt . |
| 5,430,611 * | 7/1995 | Patel et al. .................... 361/705 |
| 5,440,172 * | 8/1995 | Sutrina .................... 257/712 |
| 5,459,352 * | 10/1995 | Layton et al. .................... 257/724 |
| 5,587,882 * | 12/1996 | Patel .................... 361/705 |
| 5,604,978 | 2/1997 | Sherif et al. . |
| 5,623,394 | 4/1997 | Sherif et al. . |
| 5,659,203 | 8/1997 | Call et al. . |
| 5,718,361 | 2/1998 | Braun et al. . |
| 5,718,367 | 2/1998 | Covell, II et al. . |
| 5,745,344 * | 4/1998 | Baska et al. .................... 361/705 |
| 5,757,620 * | 5/1998 | Edwards et al. .................... 361/705 |
| 5,770,478 * | 6/1998 | Iruvanti et al. .................... 438/122 |
| 5,777,847 * | 7/1998 | Tokuno et al. .................... 361/705 |
| 5,783,862 * | 7/1998 | Deeney .................... 257/714 |
| 5,825,087 * | 10/1998 | Iruvanti et al. .................... 257/707 |
| 5,907,474 * | 5/1999 | Dolbear .................... 361/705 |
| 5,931,222 * | 8/1999 | Toy et al. .................... 165/80.3 |
| 5,981,310 * | 11/1999 | DiGiacomo et al. .................... 438/106 |
| 6,046,907 * | 4/2000 | Yamaguchi .................... 361/704 |
| 6,091,603 * | 7/2000 | Daves et al. .................... 361/704 |

\* cited by examiner

Primary Examiner—Leo P. Picard
Assistant Examiner—Boris L. Chervinsky
(74) Attorney, Agent, or Firm—Todd M. C. Li

(57) ABSTRACT

The present invention relates generally to a new apparatus and method for introducing thermal paste into semiconductor packages. More particularly, the invention encompasses an apparatus and a method that uses at least one preform of thermal paste for the cooling of at least one chip in a sealed semiconductor package. The thermal paste preform is subcooled, and is transferred onto a module component from a separable transfer sheet, or is placed onto the module component using an attached and/or imbedded mesh. The preform of thermal paste may be of simple or complex shape, and enables cooling of one or more chips in a module.

12 Claims, 1 Drawing Sheet

THERMAL PASTE PREFORMS AS A HEAT TRANSFER MEDIA BETWEEN A CHIP AND A HEAT SINK AND METHOD THEREOF

FIELD OF THE INVENTION

The present invention relates generally to a new apparatus and method for introducing thermal paste into semiconductor packages. More particularly, the invention encompasses an apparatus and a method that uses at least one preform of thermal paste for the cooling of at least one chip in a sealed semiconductor package. The thermal paste preform is subcooled, and is transferred onto a module component from a separable transfer sheet, or is placed onto the module component using an attached and/or imbedded mesh. The preform of thermal paste may be of simple or complex shape, and enables cooling of one or more chips in a module.

BACKGROUND OF THE INVENTION

Semiconductor devices are becoming smaller and more dense with the evolution of new technology. However, increases in circuit density produce a corresponding emphasis on overall chip packaging strategies in order to remain competitive. Chip and substrate manufacturers are therefore constantly being challenged to improve the quality of their products by identifying and eliminating problems, reducing package size and weight, decreasing package costs, providing improved thermal efficiencies and better and more advanced chips. Whereas significant improvements are being made to eliminate systematic problems by reducing process variability, process improvements alone are not sufficient to eliminate all the problems which effect both performance and reliability.

One way to allow high degrees of integration is to provide a highly efficient internal cooling design. A preferred way of cooling high performance SCMs (single chip modules) and MCMs (multi-chip modules) is using thermal paste. Thermal paste is often used as a high thermal conductivity interface material to fill the gaps between the back-side of chips, such as, flip chips, and the inside surfaces of the caps or heat spreaders. Producing modules that use thermal paste has multiple challenges. Module components, like the back surface of the chip and the inside of the cap must be chemically compatible with the thermal paste, so that the paste can adhere to them. The package must be designed such that the thermal paste filled chip-to-cap gap has sufficient thickness that it will form a reliable structure.

During assembly, sufficient paste must be dispensed to completely cover the chip. Care must also be taken to use a dispense pattern that will cause the entire chip to be covered. Thermal paste is often very viscous and difficult to handle or dispense. The paste dispense may be accomplished by either use of expensive automated equipment, or by manually screening the thermal paste through a template.

U.S. Pat. No. 3,993,123 (Chu et al.) discloses the thermal conduction module (TCM). This was a major advancement in the cooling of MCMs. It utilized a complex cooling hat. Over each of the flip chips on the substrate was a hole in the hat. From each hole extended a spring loaded piston that contacted the back of the chip. The module was hermetic, and filled with helium. The primary cooling path was from the circuit side of the chip, through the thickness of the chip, to the face of the piston, up the piston, to the inside of the hat, to the back of the hat, across an interface to an attached cold plate, and to the water circulating through the cold plate. The high helium content of the gas in the module greatly reduced the thermal resistance of the chip-to-piston interface and the piston-to-hat interface.

U.S. Pat. No. 4,193,445 (Chu et al.) discloses another enhancement on the TCM. Here solder was included with each of the pistons so that it could be reflowed after assembly, to fill the chip-to-piston and piston-to-hat gaps, for improved thermal performance.

U.S. Pat. No. 4,226,281 (Chu) disclosed an enhancement to the TCM. Rather than just one piston per chip, each chip now had a matrix of pistons that contacted the back of the chip for cooling. To maintain almost full coverage of the back of the chip, headers are used on the faces of each of the pistons.

U.S. Pat. No. 5,005,638 (Goth et al.) disclose an improved piston geometry. Barrel shaped pistons were used to allow tighter piston to hat gaps, while maintaining the ability to accommodate chip tilt. Material changes also improved thermal performance over the traditional TCM. Pistons were now made of copper rather than aluminum, and the module was now filled with oil rather than helium.

U.S. Pat. No. 5,023,695 (Umezawa et al.) discloses a flat plate cooling (FPC). In this structure, a flat cooling plate is just above the array of chips. Thermal paste is used to fill the gaps between the chips and the flat plate.

U.S. Pat. No. 5,098,609 (Iruvanti et al.) the disclosure of which is incorporated herein by reference, discloses stable high solids, high thermal conductivity pastes. The pastes include a thermally conducting solid filler, a non-aqueous liquid carrier and a stabilizing dispersant. The resulting pastes are highly concentrated, of low viscosity, electrically resistive, highly thermally conducting and stable.

U.S. Pat. No. 5,291,371 (Gruber et al.) disclose a thin high performance cooling structure. The purpose of the structure is to establish and maintain a thin solder interface between the chips and the cooling hat. In order for this to be functional and reliable, the solder and the hat have to be very flat, and a thin lubricant is between them. The solder can be positioned onto the chip as a preform (and then reflowed or plastically deformed).

U.S. Pat. No. 5,325,265 (Turlik et al.) discloses a higher performance version of flat plate cooling. In this invention thermally conductive cushions conduct heat from the backs of the chips to the inside surface of the hat. The hat has shallow cavities above each of the chips. The cushions are low melting point solder, preferably indium. The indium may be placed between the chips and the hat as preforms.

U.S. Pat. No. 5,591,789 (Iruvanti et al.) the disclosure of which is incorporated herein by reference, discloses a polyester dispersant for use in high thermal conductivity pastes.

U.S. Pat. Nos. 5,604,978, 5,623,394 and 5,724,729, (Sherif et al.) the disclosure of which is incorporated herein by reference, disclose a method and apparatus for the customized cooling of chips on an MCM with a range of cooling requirements. It uses flat plate cooling, and uses pastes of different thermal conductivities on chips to customize the cooling of the chips. The paste is either between the chips and a flat cooling hat, or between the chip and a blind hole in the hat. Surplus paste may also fill some or all of the rest of the inside of the module.

U.S. Pat. No. 5,718,361 (Braun, et al.) the disclosure of which is incorporated herein by reference, discloses an apparatus and method for forming mold for metallic material. Braun also discloses the use of a mold to form heat sinks with fins.

U.S. Pat. No. 5,718,367 (Covell, et al.) the disclosure of which is incorporated herein by reference, discloses a mold transfer apparatus and method.

Covell also discloses the use of a mold transfer to form a high density heat sink.

U.S. Pat. Nos. 5,757,620 and 5,819,401, (Edwards, et al.) the disclosure of which is incorporated herein by reference, discloses a method and apparatus for cooling of chips using blind holes with customized depth. It uses flat plate cooling, and varies the depth of the thermal paste filled gap to customize the cooling to each of the chips on a module, such as, a MCM (Multi-Chip Module).

U.S. patent application Ser. No. 08/758,789, filed on Dec. 3, 1996, now U.S. Pat. No. 5,825,087, and No. 5,770,478, (Iruvanti, et al.) the disclosure of which is incorporated herein by reference, discloses a hermetically sealed module where the internal surface of the module has a roughened surface by grit blasting or machined to have parallel and/or crossing grooves. The paste penetrates the roughened surface and inhibits the flow of the paste out of the gap.

U.S. patent application Ser. No. 09/140,583, filed on Aug. 26, 1998, (Edwards, et al.) the disclosure of which is incorporated herein by reference, discloses a structure and a method that uses surface chemistry modification of the inside of the thermal cooling cap where it contacts the thermal paste. This is done by modifying the internal surface of the cap by embedding particles that preferably have the same chemical composition as one or more of the solids in the thermal paste.

As stated earlier a variety of internal cooling means have been disclosed, using complicated hardware designs, helium filled modules, solder interfaces, thermal paste filled interfaces, etc. Thermal paste offers the combination of low cost hardware, high thermal performance, and module reworkability. What is needed are improved methods of introducing thermal paste into semiconductor modules.

One way to improve the application of thermal paste in semiconductor modules would be to use thermal paste preforms. The preforms can be formed with conventional thermal paste, and then subcooled to temporarily increase stiffness and decrease tackiness. The thermal paste may be on a transfer sheet, or attached to a mesh and would be transferred onto or associated with the chip that needs to be cooled.

PURPOSES AND SUMMARY OF THE INVENTION

The invention is a novel method and an apparatus for making and using at least one preform of thermal paste for the cooling of at least one chip in a capped module.

Therefore, one purpose of this invention is to provide an apparatus and a method that will allow the making and using of at least one preform of thermal paste for the cooling of at least one chip in a capped module.

Another purpose of this invention is to provide thermal paste preforms that are of simple or complex shapes.

Yet another purpose of this invention is to provide preforms of thermal paste that are used to cool one or more chips in a module.

Still yet another purpose of this invention is to provide thermal paste preforms that are transferred onto modules from separable transfer sheets, or are placed onto modules using an attached and/or imbedded mesh.

Still another purpose of this invention is to provide thermal paste preforms to enhance the thermal path between a chip and a heat sink.

One advantage of the current invention is that the thermal paste may be incorporated into the module without the requirement for expensive automated tooling.

Another advantage of the current invention is that complex templates are not required.

Yet, another advantage of this invention is the improved control of the quantity of paste applied to each chip.

Still, another advantage of this invention is the ability to use complex patterns.

Still, yet another advantage of this invention is the improved reliability, when the mesh is used and is left inside the module. Another advantage of this invention is eliminating the need for manual screening of paste.

Yet another advantage of this invention is the reduced cycle time for assembly of a module.

Therefore, in one aspect this invention comprises a heat transfer structure comprising at least one preformed slug of at least one thermal paste sandwiched between at least one chip, acting as at least one heat source, and at least one thermal dissipation device.

In another aspect this invention comprises a heat transfer apparatus comprising at least one heat generating device with at least one thermal paste preform secured to at least one surface of said at least one heat generating device.

In yet another aspect this invention comprises a process for providing heat transfer to at least one chip, comprising the step of placing at least one preformed slug of at least one thermal paste on said chip to provide said heat transfer.

In still another aspect this invention comprises a process of forming at least one preformed slug of at least one thermal paste, comprising the steps of:

(a) filling at least one mold with at least one thermal paste,
(b) subcooling said mold and said thermal paste to a temperature that temporarily stiffens and reduces the tackiness of said thermal paste to form said at least one preformed slug, and
(c) removing said formed subcooled preform slug from said mold.

DESCRIPTION OF THE DRAWINGS

The features of the invention believed to be novel and the elements characteristic of the invention are set forth with particularity in the appended claims. The drawings are for illustration purposes only and are not drawn to scale. Furthermore, like numbers represent like features in the drawings. The invention itself, however, both as to organization and method of operation, may best be understood by reference to the detailed description which follows taken in conjunction with the accompanying drawings in which:

DETAILED DESCRIPTION OF THE INVENTION

This invention describes one way to improve the assembly of multilayered ceramic (MLC) electronic packages without any loss or degradation of their performance. Packaging methods which improve assembly increase the desirability of such electronic packages in the marketplace. As a person skilled in the art knows, increases in packaging density typically require high performance cooling solutions. There are numerous advantages to cooling with thermal paste.

Figure 1:
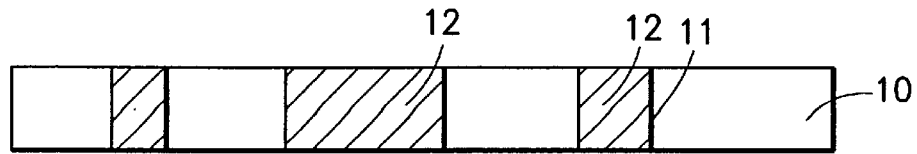
FIG. 1, illustrates a mold containing the thermal paste preform of this invention.

FIG. 1, illustrates at least one mold or template 10, containing at least one thermal paste preform or disc 12. The thermal paste preform 12, can be of a simple or a complex shape, typically, the shape of at least one surface of the thermal paste preform could be selected from a group comprising, triangular shape, square shape, rectangular shape, circular shape, elliptical shape, polygonal shape, X-shape, or some odd shape, to name a few. It is preferred that the material for the thermal paste preform should be such that it has a temporary increase in stiffness and decrease in tackiness between about 20° C. and about minus 100° C. Wall angle 11, of the openings in the mold 10, can be 90 degrees or more than 90 degrees to help facilitate the removal of the preform 12.

Figure 2A:
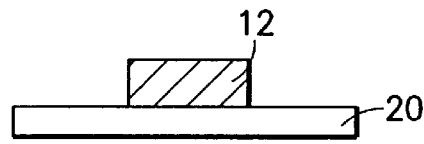
FIG. 2A, shows one embodiment of the invention with the thermal paste preform on a transfer sheet.

FIG. 2A, shows one embodiment of the invention with the thermal paste disk or preform 12, on a transfer sheet 20. The disk of thermal paste 12, is preferably temporarily attached to a transfer sheet 20. However, for some applications the transfer sheet 20, could itself have good thermal conductivity and could be integrated into or be a part of the heat transfer structure or preform 12.

Figure 2B:
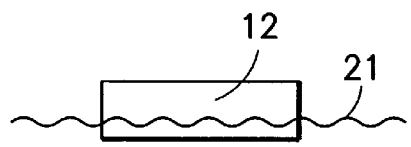
FIG. 2B, shows another embodiment of the invention with the thermal paste preform having an imbedded mesh.

FIG. 2B, shows another embodiment of the invention with the thermal paste preform 12, which has been integrated into at least one imbedded mesh 21, such as, a mesh screen 21.

For some applications the thermal paste preform 12, may be prepared by placing a blob of thermal paste onto a transfer sheet 20, or a mesh 21, and subcooling the thermal paste to reduce tackiness and increase viscosity and thereby forming the thermal paste preform 12.

The thermal paste preform 12, could be a disc shaped, or as stated earlier, it could have many different shapes.

A single transfer sheet 20, containing a single preform 12, has been shown in FIG. 2A, however, one could have one or more transfer sheet 20, having one or more thermal paste preforms 12. Similarly, one or more imbedded mesh 21, shown in FIG. 2B, could have one or more attached preforms 12. Multiple preforms 12, on a transfer sheet 20, or mesh 21, would of course help facilitate the simultaneous placement of these preforms 12, such as, on an array of chips in a module.

Similarly, the preforms for the different chips could vary in shape and/or composition, or the preforms themselves on a given transfer sheet 20, or imbedded mesh 21, could be similar or different. For example, one preform 12, could be taller, while another preform 12, could be wider, while another could be of a different thermal paste.

The thermal paste preform 12, could also be attached to a sheet 20, or a thin mesh 21. In this case the thermal paste preform 12, could become integrated with the thin mesh 21, such as, a thin wire mesh 21.

Figure 5:
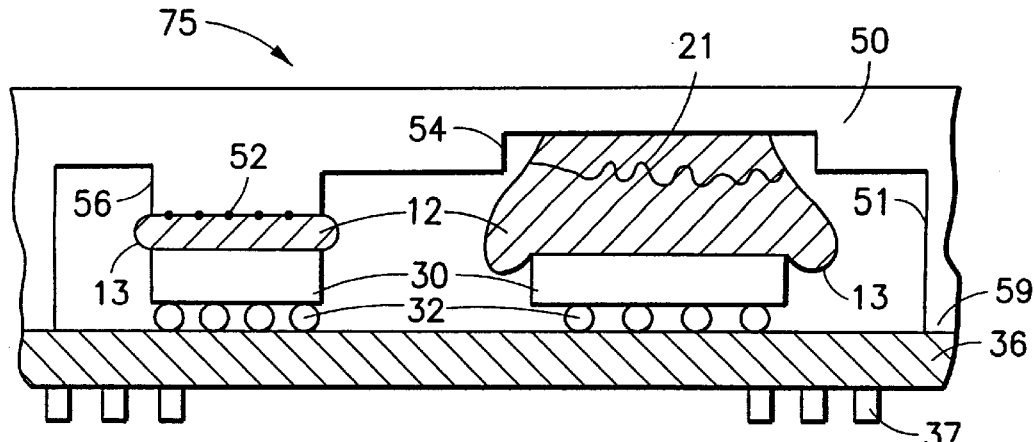
FIG. 5, illustrates a cross-sectional view of a MCM showing the deformed thermal paste preforms of this invention which are used to cool chips in the module.

The mesh 21, can be of conductive or non-conductive materials, however, it needs to be thin enough to fit between a chip 30, and a heat dissipation device 50, as shown in FIG. 5. The thermal or heat dissipation device 50, could be a thermal cap 50, a heat spreader 50, to name a few. The thermal paste preform 12, could be attached to a transfer sheet 20, and have an imbedded mesh 21.

One benefit of the imbedded mesh 21, over a transfer sheet 20, is that it is has higher throughput since the mesh 21, will be left inside a module, while the transfer sheet 20, usually is removed. Another benefit is the enhanced reliability, since the imbedded mesh 21, impedes the flow of the thermal paste 12, out of the chip-to-cap gap, and is thus more forgiving of larger gaps.

Figure 3:
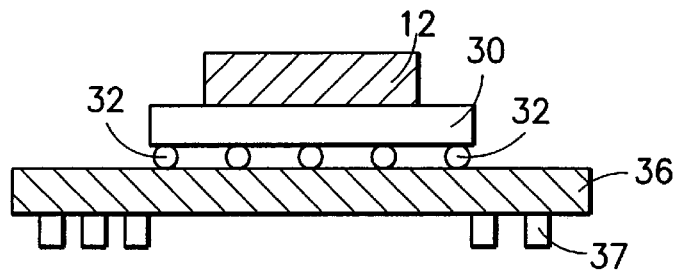
FIG. 3, illustrates the transfer of a thermal paste preform onto a heat generating device.

FIG. 3, illustrates the transfer of a thermal paste preform 12, onto a heat generating device 30, such as, a chip 30. The transfer sheet 20, may be used to place the thermal paste preform 12, on top of a chip 30, and then the transfer sheet 20, may be removed. However, as stated earlier, for some applications the transfer sheet 20, may be left inside the final module, i.e., between the cap 50, and the chip 30.

Typically, a substrate 36, with I/O 37, has one or more chips 30, connected to it by solder balls or C4 (Controlled Collapse Chip Connection) or solder mass 32. The physical dimensions of the thermal paste preform 12, will depend upon the application, for example, for a chip that needs a shorter heat transfer path, the thermal paste preform 12, could be thinner, however, if the gap between the chip and the thermal cap is wider, then a thicker thermal paste preform 12, would be needed. It is preferred that in the final assembly the deformed thermal paste preform 12, cover the entire back surface of the chip 30. However, for some applications the thermal paste preform 12, could leave a portion of the periphery of the back surface of the chip 30, exposed, and for some applications the thermal paste preform 12, could extend beyond the periphery of the back surface of the chip 30, as more clearly shown in FIG. 4.

Figure 4:
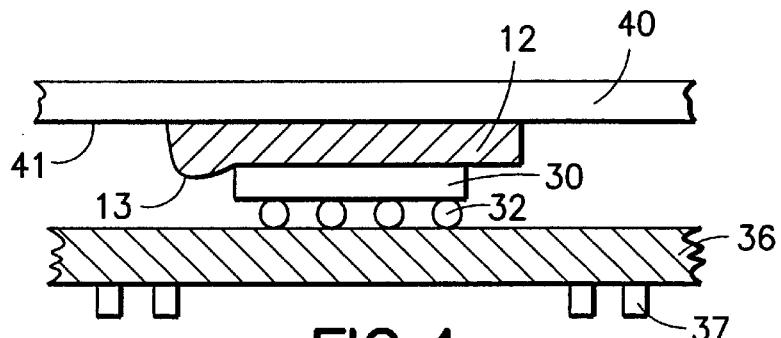
FIG. 4, illustrates a cross-sectional view of a module using the thermal paste preform of this invention.

FIG. 4, illustrates a cross-sectional view of a module using the thermal paste preform of this invention. The thermal paste preform 12, provides a direct heat transfer path between the chip 30, and a thermal cap 40, and provides, and deforms during the assembly to assure contact with both the chip 30, and the cap 40. It is preferred that the thermal paste preform 12, provide a good thermal contact between the chip 30, and the cap 40. To assure this, the initial thickness of the preform needs to be greater than or equal to the chip-to-cap gap in the finished assembly. However, for some applications under pressure a bulge 13, appears, instead of the load or pressure being transmitted to the adjacent features.

FIG. 5, illustrates a cross-sectional view of a MCM showing the thermal paste preforms 12, of this invention which are used to cool chips 30, in the module.

Typically, the substrate 36, with I/O 37, has one or more chips 30, connected to it by solder balls or solder mass 32. The thermal paste preforms 12, thermally connect the chips 30, to a thermal cap 50, and provide a direct thermal transfer path. The chips 30, may have similar or different sizes and may have similar or different performance characteristics. The thermal paste preform 12, that is used at different chip sites may be similar or different. The thermal cap 50, could have an inner surface 51, over each chip, which inner surface 51, may be flat (not shown), or have a protrusion or pedestal 56, or may have a blind hole or cavity 54.

For some applications the inner surface 51, of a thermal cap 50, could have a plurality of particles 52, embedded into the inner surface 51. At least one of the heat transfer particles 52, that is embedded is preferably of the same material as a particle that will be used in making the thermal paste that will subsequently come in thermal contact with the inner surface 51, of the thermal cap 50, and provide the thermal transfer.

It is preferred that the thermal paste preform 12, should be sufficient in placement and volume to completely cover the surface of the chips 30, and also fill the thermal path to the cap 40 and 50.

It is also preferred that the thermal paste preform 12, have a thickness that is greater than or equal to the assembled chip-to-cap gap. However, for some applications under pressure a bulge 13, appears, instead of the load or pressure being transmitted to the adjacent features.

The thermal paste preforms 12, can be manufactured in several ways. The preforms may be made using conventional thermal pastes. The thermal paste is formed to the desired shape at room temperature or at an elevated temperature (to decrease viscosity). The desired shape may be achieved by using a mold, template, or an automated dispense tool. If a mold or template is used, the paste may be removed from the mold or template at elevated temperature, room temperature, or after sub-cooling, depending on the type of thermal paste used. Before subcooling, the thermal paste preform is attached to a transfer sheet, or a mesh, or it has a mesh embedded in it. The preform is subcooled to stiffen it and decrease tackiness. The preforms are normally shipped and stored sub-cooled. With optimal material selection and packaging, sub-cooling, is not required for storage or shipping.

In the preferred embodiment, the preforms are subcooled (e.g. less than room temperature) when they are placed on the chips or on the lid. If a transfer sheet is being used, it is normally removed before the thermal paste begins to warm. If a mesh is being used, it is left with the thermal paste. To assure proper thermal performance, the minimum thickness of the preform must exceed the maximum possible chip to lid gap (for that chip site). To maximize adhesion of the paste to the chip and lid, and to avoid damage, the paste is allowed to warm and soften before the lid is clamped to, and permanently attached to the substrate.

The particles 52, may be embedded by any of several methods known in the art, for example casting, grit blasting, or pressing, to name a few. The entire internal surface 41 or 51, of the thermal cap 40 or 50, may be altered, or only those areas 41 or 51, immediately above the flip chips 30, where the enhanced thermal transfer path is desired is altered.

Since each chip 30, on an MCM 75, may have differing cooling requirements, two or more different thermal paste preforms 12, may be used in the same module 75, and in those cases if the thermal paste preforms 12, have different chemical compositions it may be desirable to use different surface modifications at the different sites, to correspond to the different thermal paste preforms 12, that may be used.

The current invention uses preforms of thermal paste 12, in the assembly of SCMs and MCMs. The temporarily stiffened thermal paste 12, (by sub-cooling) may be temporarily attached to a transfer sheet 20, or it may have an imbedded mesh 21, as shown in FIG. 5.

The paste preform may have many different shapes to enable paste placement and chip coverage. The preforms may be separate shapes for each chip, larger shapes to cover multiple smaller chips, or multiple shapes (to merge upon assembly) for large chips.

The preforms may have paste for just one chip or for multiple chips on a module. For the case of preforms for multiple chip sites, the pastes used in the preforms may be similar for all chip sites, or it may be different for different chip sites.

One reason for varying the thermal paste used on the preform would be to vary the thermal conductivity of the pastes in order to customize the cooling of the chips.

Another potential reason to vary the thermal pastes from one site to another is to take advantage of the different adhesive properties for different materials used in the chips or cap.

The thermal paste preform may be formed and attached to either a mesh 21, or transfer sheet 20, by any of several ways known in the art.

In a preferred embodiment, the thermal paste is formed into the desired shape and thickness and then precooled to increase stiffness and decrease tackiness. A mesh 21, may be imbedded in the thermal paste preform by a variety of techniques. In a preferred embodiment, the mesh 21, is imbedded by applying thermal paste to both sides of the mesh 21.

In an alternate embodiment, the mesh is imbedded by applying paste on one side of the mesh under pressure, so that some of the thermal paste extrudes through the mesh.

In a preferred embodiment, the current invention uses surface modification of the caps used in the assembly of flip chip SCMs and MCMs, to enhance the reliability.

For the case of multiple thermal pastes used in an MCM, the same surface treatment may be applied at all chip sites when the pastes use at least one of the same solids, or different surface modifications may be employed when the pastes are dissimilar.

In an alternative embodiment, the thermal paste preform can adhere well to both the chip and the lid, and no particles are imbedded in the lid.

This invention further allows the ability to build with higher throughput, and therefore at lower cost.

In the preferred embodiment, the particles embedded into the surface of the thermal cap could be of the same size or material characteristics as the solids in the thermal paste, or could be of a different size or characteristics than the solids in the thermal paste.

The chips may have similar or different sizes. The thermal paste preforms used at different chip sites may be similar or different. The cap over each chip may be flat (not shown), or have a pedestal 56, as shown over chip 30, or may have a cavity 54, as shown over chip 30. The thermal paste preform 12, is sufficient in placement and volume to completely cover chip 30, and fill the thermal path to the cap 40 or 50. The thermal paste preform 12, at room temperature is typically very viscous, and difficult to handle. Therefore, the thermal paste preform 12, is normally dispensed onto the transfer sheet 20 or mesh 21, by either manually screening thermal paste through a template, or by use of an automated dispense tool.

During the process of forming the preform 12, it is preferred that the thermal paste preform 12, is sub-cooled to a temperature of between about 20° C. and about minus 100° C. However, of some applications the thermal paste preform is sub-cooled to a temperature of at least about minus 20° C.

It is preferred that least one preform 12, makes a good thermal contact with the heat or thermal dissipation device 50, and wherein at least one of the heat dissipation device 50, could be selected from a group consisting of thermal cap, heat spreader, to name a few.

Additional throughput increases can be achieved on MCMs when multiple preforms are applied simultaneously to all the flip chips on the module by using a single mesh 21, or transfer sheet 20.

EXAMPLES

The following examples are intended to further illustrate the invention and are not intended to limit the scope of the invention in any manner.

Example 1

In a preferred embodiment, the cooling cap is made of aluminum, and on at least a portion of its internal surface alumina particles are embedded to be compatible with thermal paste preforms containing an alumina filler. A subcooled preform of thermal paste with attached transfer sheet is placed over the chips on the module. The transfer sheet is peeled off, leaving the subcooled thermal paste preforms on the chips. The lid is placed on the assembly, and the thermal paste is allowed to warm to approach room temperature so that the thermal paste adheres to the chip and lid, and softens prior to compression. The lid is then pushed down onto the substrate, deforming the preform to fill the chip to cap gap, and the lid is attached to the substrate.

Example 2

In an alternative embodiment, different thermal paste preforms utilizing different solids are used, and the thermal cap is not made from the same material as one of the solids in the thermal paste preforms, but the surface is embedded with particles of the same material as used for one of the solids in the thermal paste preform. A subcooled preform of thermal paste with an embedded mesh is placed over the chips on the module. The lid is placed on the assembly, and the thermal paste is allowed to warm to approach room temperature so that the thermal paste adheres to the chip and lid, and softens prior to compression (of the preform). The lid is then pushed down onto the substrate, deforming the preform to fill the chip to cap gap, and the lid is permanently attached to the substrate. The mesh stays between the chip and lid, and is thin enough so that it will not damage the chip during (the compression part of) the module assembly.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A thermal paste preform for assembly in a semiconductor package having a heat generating device and a heat dissipation device with a gap therebetween, the thermal paste preform comprising a slug of thermal paste material, said slug having a shape so as to substantially cover said heat generating device upon assembly in the semiconductor package, said slug having a slug thickness not less than the gap between the heat generating device and the heat dissipation device, said slug having a temperature and having stiffness and tackiness properties in accordance with the temperature thereof, so that the stiffness and tackiness properties of the slug facilitate shipping and storing of said thermal paste preform.

2. The thermal paste preform of claim 1, wherein said slug is attached to a transfer sheet and wherein said transfer sheet is detachable from said slug, so that said transfer sheet facilitates assembly of said slug in a semiconductor package.

3. The thermal paste preform of claim 1, wherein said slug further comprises a mesh imbedded therein, said mesh having a mesh thickness substantially smaller than said slug thickness.

4. The thermal paste preform of claim 3 wherein said mesh is of a conductive material.

5. The thermal paste preform of claim 3, wherein said mesh is of a non-conductive material.

6. The thermal paste preform of claim 1, wherein said slug is attached to a transfer sheet, said transfer sheet is detachable from said slug, and said slug further comprises a mesh imbedded therein, said mesh having a mesh thickness substantially smaller than said slug thickness.

7. A semiconductor package comprising:

a heat source;

a slug formed of thermal paste, said slug having an assembled slug thickness;

a mesh imbedded within said slug, said mesh having a mesh thickness substantially smaller than said assembled slug thickness; and a thermal dissipation device, assembled so that said slug is sandwiched between and in thermal contact with said heat source and said thermal dissipation device, and so that said mesh imbedded within said slug impedes the flow of said thermal paste.

8. The semiconductor package of claim 7, wherein said mesh is of a conductive material.

9. The semiconductor package of claim 7, wherein said mesh is of a non-conductive material.

10. The semiconductor package of claim 7, wherein said heat source is a semiconductor chip.

11. The semiconductor package of claim 7, wherein said thermal dissipation device is a thermal cap.

12. The semiconductor package of claim 7, wherein said thermal dissipation device is a heat.

* * * * *

UNITED STATES PATENT AND TRADEMARK OFFICE
CERTIFICATE OF CORRECTION

PATENT NO.     : 6,275,381 B1
DATED          : August 14, 2001
INVENTOR(S)    : Edwards et al.

It is certified that error appears in the above-identified patent and that said Letters Patent is hereby corrected as shown below:

Column 10,
Line 45, insert -- spreader -- after "heat".

Signed and Sealed this

Fourteenth Day of January, 2003

JAMES E. ROGAN
*Director of the United States Patent and Trademark Office*